United States Patent
Jeong et al.

(10) Patent No.: US 7,871,866 B2
(45) Date of Patent: Jan. 18, 2011

(54) METHOD OF MANUFACTURING SEMICONDUCTOR DEVICE HAVING TRANSITION METAL OXIDE LAYER AND RELATED DEVICE

(75) Inventors: Jun-Ho Jeong, Gyeonggi-do (KR); Jang-Eun Lee, Gyeonggi-do (KR); Se-Chung Oh, Gyeonggi-do (KR); Kyung-Tae Nam, Gyeonggi-do (KR); In-Gyu Baek, Seoul (KR)

(73) Assignee: Samsung Electronics Co., Ltd. (KR)

( * ) Notice: Subject to any disclaimer, the term of this patent is extended or adjusted under 35 U.S.C. 154(b) by 354 days.

(21) Appl. No.: 12/175,602

(22) Filed: Jul. 18, 2008

(65) Prior Publication Data

US 2009/0020745 A1    Jan. 22, 2009

(30) Foreign Application Priority Data

Jul. 20, 2007    (KR) ..................... 10-2007-0072959

(51) Int. Cl.
*H01L 21/332* (2006.01)
(52) U.S. Cl. .................. 438/128; 257/E47.001
(58) Field of Classification Search .......... 257/4, 257/E21.351, E47.001; 438/382, 3, 253, 438/128, 598, 618
See application file for complete search history.

(56) References Cited

U.S. PATENT DOCUMENTS

| 4,107,019 A | * | 8/1978 | Takao et al. .................. 204/425 |
| 6,579,729 B2 | | 6/2003 | Goebel et al. |
| 6,631,085 B2 | | 10/2003 | Kleveland et al. |
| 2006/0157683 A1 | | 7/2006 | Scheuerlein |

FOREIGN PATENT DOCUMENTS

| JP | 05-275711 | 10/1993 |
| JP | 2002-056666 | 2/2002 |
| KR | 1020060042734 A | 5/2006 |

* cited by examiner

*Primary Examiner*—Thomas L Dickey
*Assistant Examiner*—Nikolay Yushin
(74) *Attorney, Agent, or Firm*—Myers Bigel Sibley & Sajovec, P.A.

(57) ABSTRACT

Provided is a method of manufacturing a semiconductor device having a switching device capable of preventing a snake current. First, a transition metal oxide layer and a leakage control layer are alternately stacked on a substrate 1 to 20 times to form a varistor layer. The transition metal oxide layer is formed to contain an excessive transition metal compared to its stable state. The leakage control layer may be formed of one selected from the group consisting of a Mg layer, a Ta layer, an Al layer, a Zr layer, a Hf layer, a polysilicon layer, a conductive carbon group layer, and a Nb layer.

27 Claims, 12 Drawing Sheets

METHOD OF MANUFACTURING SEMICONDUCTOR DEVICE HAVING TRANSITION METAL OXIDE LAYER AND RELATED DEVICE

CROSS-REFERENCE TO RELATED APPLICATION

This application claims the benefit of Korean Patent Application No. 10-2007-0072959, filed Jul. 20, 2007, the contents of which are hereby incorporated herein by reference in their entirety.

BACKGROUND OF THE INVENTION

1. Field of the Invention

The present invention relates generally to semiconductor memory devices and, more particularly, to methods of manufacturing semiconductor devices.

2. Description of the Related Art

Research into high integration of memory devices has been widespread. A memory device includes a plurality of word lines, a plurality of bit lines, and a plurality of memory cells. Memory devices are classified as volatile memory devices and non-volatile memory devices depending on characteristics of data stored in the memory cells. A non-volatile memory device maintains data stored in the memory cells even when power is cut off.

A non-volatile memory device includes a flash memory, a Magnetic Random Access Memory (MRAM), a Ferroelectric Random Access Memory (FRAM), a Phase-change Random Access Memory (PRAM), a Resistance Random Access Memory (RRAM), etc.

In order to implement a memory device, a technique, in which the word lines are aligned parallel to each other, and the bit lines are aligned parallel to each other, so that the bit lines cross the word lines, is widely used. The memory cells are disposed at intersections of the word lines and the bit lines. An electric signal may be applied to a selected one of the word lines and a selected one of the bit lines, so that data can be written to and read from a selected one of the memory cells.

Each of the word lines is electrically connected to the plurality of memory cells. Similarly, each of the bit lines is electrically connected to the plurality of memory cells. A snake current is generated through the non-selected memory cells that are connected to the selected bit line or the selected word line. A snake current can cause memory cells to malfunction.

To highly integrate a memory device, a technique, in which the memory cells are three-dimensionally stacked, has been employed. In this case, the snake current may be further increased.

Another method of three-dimensionally stacking memory cells is disclosed in U.S. Pat. No. 6,631,085B2 entitled "Three Dimensional Memory Array Incorporating Serial Chain Diode Stack" to Kleveland.

SUMMARY OF THE INVENTION

An exemplary embodiment of the invention provides a method of manufacturing a semiconductor device having a switching device capable of preventing a snake current.

Another exemplary embodiment of the invention provides a semiconductor device employing a switching device capable of preventing a snake current.

In one aspect, the present invention is directed to a method of manufacturing a semiconductor device. The method includes stacking a transition metal oxide layer and a leakage control layer on a substrate to form a varistor layer. The transition metal oxide layer is formed to contain an excessive transition metal compared to its stable state.

In some exemplary embodiments of the present invention, a lower interconnection electrically connected to a lower end of the varistor layer may be formed. An intermediate interconnection electrically connected to an upper end of the varistor layer may be formed. Also, a data storage element may be formed between the varistor layer and the intermediate interconnection. The data storage element may be formed of one selected from the group consisting of a variable resistance layer, a phase-change material layer, a polymer pattern, a magnetic tunnel junction (MTJ), and a ferroelectric pattern.

In other exemplary embodiments, a first electrode may be formed between the lower interconnection and the varistor layer. A second electrode may be formed between the varistor layer and the data storage element. The first electrode may be formed of one selected from the group consisting of an iridium (Ir) layer, a platinum (Pt) layer, a nickel (Ni) layer, a ruthenium (Ru) layer, a palladium (Pd) layer, a gold (Au) layer, a silver (Ag) layer, a copper (Cu) layer, and a cobalt (Co) layer. The second electrode may be formed of one selected from the group consisting of an iridium (Ir) layer, a platinum (Pt) layer, a nickel (Ni) layer, a ruthenium (Ru) layer, a palladium (Pd) layer, a gold (Au) layer, a silver (Ag) layer, a copper (Cu) layer, and a cobalt (Co) layer.

In still other exemplary embodiments, the first electrode and the second electrode may be formed of the same material.

In yet other exemplary embodiments, the variable resistance layer may be formed of a transition metal oxide layer having a different composition ratio from the varistor layer.

In yet other exemplary embodiments, an upper varistor layer may be formed on the intermediate interconnection. An upper data storage element may be formed on the upper varistor layer. An upper interconnection may be formed on the upper data storage element. The upper varistor layer may be formed by alternately stacking the transition metal oxide layer and the leakage control layer on the intermediate interconnection 1 to 20 times.

In yet other exemplary embodiments, the transition metal oxide layer may be formed of one selected from the group consisting of a TiO layer, a NbO layer, a NiO layer, a ZnO layer, a HfO layer, a YO layer, a VO layer, a CrO layer, a MoO layer, a WO layer, and a ZrO layer.

In yet other exemplary embodiments, the transition metal oxide layer may be formed of a material, in which one selected from the group consisting of Ir, Pt, Ru, Ni, Pd, Au, Ag, and Co, is added to one selected from the group consisting of a TiO layer, a NbO layer, a NiO layer, a ZnO layer, a HfO layer, a YO layer, a VO layer, a CrO layer, a MoO layer, a WO layer, and a ZrO layer.

In yet other exemplary embodiments, the leakage control layer may be formed of one selected from the group consisting of a Mg layer, a Ta layer, an Al layer, a Zr layer, a Hf layer, a polysilicon layer, a conductive carbon group layer, and a Nb layer.

In yet other exemplary embodiments, the varistor layer may be formed by alternately stacking the transition metal oxide layer and the leakage control layer 1 to 20 times.

In another aspect, the present invention is also directed to a semiconductor device. The device includes a substrate and a varistor disposed on the substrate. The varistor includes a transition metal oxide pattern and a leakage control pattern. The transition metal oxide pattern contains an excessive transition metal compared to its stable state.

In some exemplary embodiments, a lower interconnection electrically connected to a lower end of the varistor may be provided. An intermediate interconnection crossing the lower interconnection and electrically connected to an upper end of the varistor may be provided. Further, a data storage element may be disposed between the varistor and the intermediate interconnection. A first electrode may be disposed between the lower interconnection and the varistor. A second electrode may be disposed between the varistor and the data storage element. The first electrode and the second electrode may be formed of the same material. The data storage element may be formed of one selected from the group consisting of a variable resistance layer, a phase-change material layer, a polymer pattern, a MTJ, and a ferroelectric pattern.

In other exemplary embodiments, upper interconnection crossing over the intermediate interconnection may be provided. An upper varistor may be disposed between the intermediate interconnection and the upper interconnection. An upper data storage element may be disposed between the upper varistor and the upper interconnection. The upper varistor may be formed by alternately stacking the transition metal oxide pattern and the leakage control pattern 1 to 20 times.

In still other exemplary embodiments, a third electrode may be disposed between the intermediate interconnection and the upper varistor. A fourth electrode may be disposed between the upper varistor and the upper data storage element. The third electrode and the fourth electrode may be formed of the same material.

In yet other exemplary embodiments, the transition metal oxide pattern may be formed of one selected from the group consisting of a TiO layer, a NbO layer, a NiO layer, a ZnO layer, a HfO layer, a YO layer, a VO layer, a CrO layer, a MoO layer, a WO layer, and a ZrO layer.

In yet other exemplary embodiments, the transition metal oxide pattern may be formed of a material, in which one selected from the group consisting of Ir, Pt, Ru, Ni, Pd, Au, Ag, and Co, is added to one selected from the group consisting of a TiO layer, a NbO layer, a NiO layer, a ZnO layer, a HfO layer, a YO layer, a VO layer, a CrO layer, a MoO layer, a WO layer, and a ZrO layer.

In yet other exemplary embodiments, the leakage control pattern may be formed of one selected from the group consisting of a Mg layer, a Ta layer, an Al layer, a Zr layer, a Hf layer, a polysilicon layer, a conductive carbon group layer, and a Nb layer.

In yet other exemplary embodiments, the varistor may be formed by alternately stacking the transition metal oxide pattern and the leakage control pattern 1 to 20 times.

BRIEF DESCRIPTION OF THE DRAWINGS

The foregoing and other objects, features and advantages of the invention will be apparent from the more particular description of an exemplary embodiment of the invention, as illustrated in the accompanying drawings. The drawings are not necessarily to scale, emphasis instead being placed upon illustrating the principles of the invention.

DETAILED DESCRIPTION OF THE INVENTION

Figure 1:
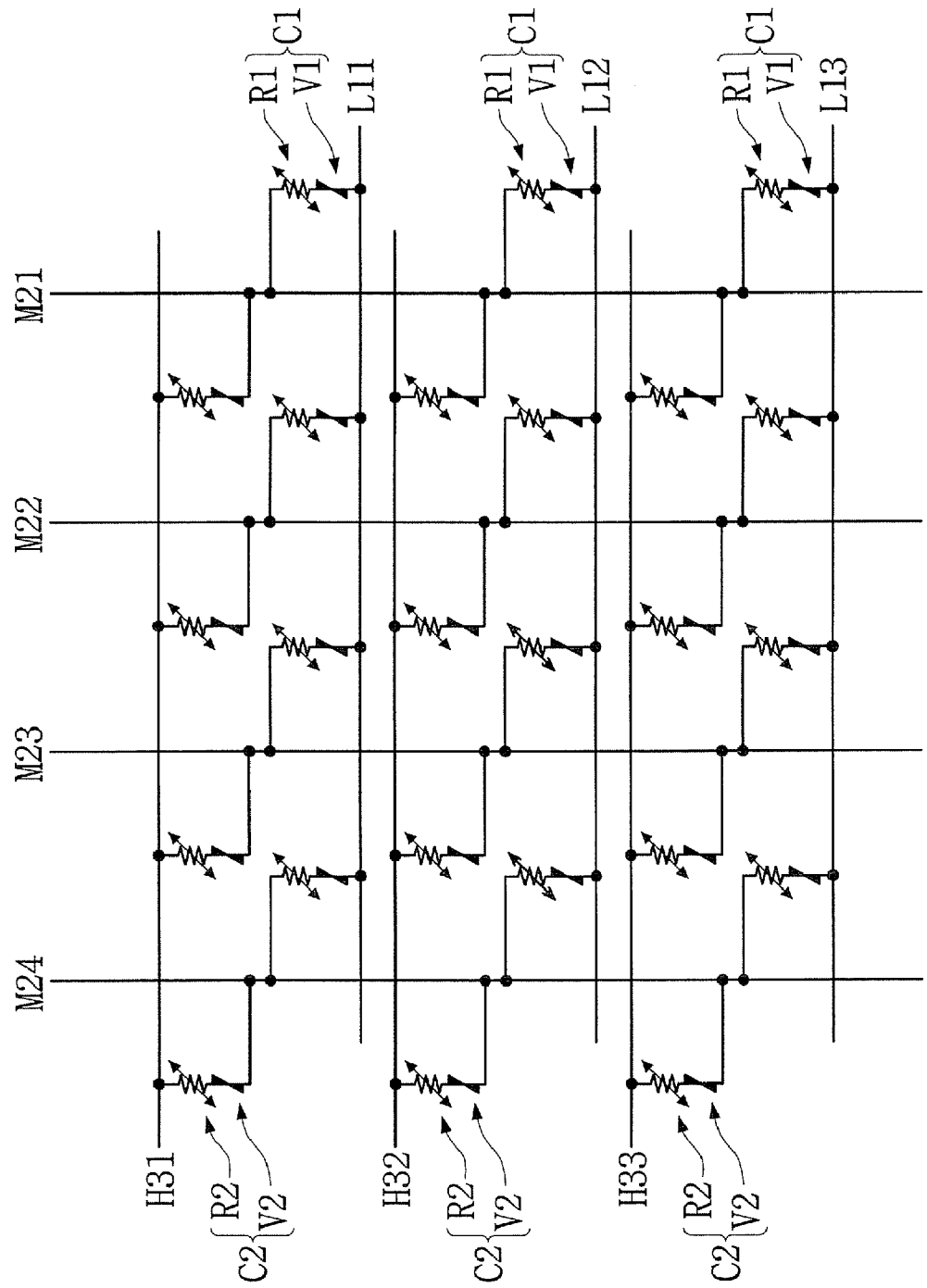
FIG. 1 is an equivalent circuit diagram of a cell array region of a Resistance Random Access Memory (RRAM) according to an exemplary embodiment of the present invention.

The present invention is described more fully hereinafter with reference to the accompanying drawings, in which example embodiments of the invention are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to," "coupled to" or "responsive to" another element or layer, it can be directly on, connected, coupled or responsive to the other element or layer or intervening elements or layers may be present. In contrast, when an element is referred to as being "directly on," "directly connected to," "directly coupled to" or "directly responsive to" another element or layer, there are no intervening elements or layers present. Like numbers refer to like elements throughout. As used herein, the term "and/or" includes any and all combinations (mixtures) of one or more of the associated listed items and may be abbreviated as "/".

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The structure and/or the device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

It should also be noted that in some alternate implementations, the functionality of a given block may be separated into multiple blocks and/or the functionality of two or more blocks may be at least partially integrated.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and the present application, and will not be interpreted in an idealized or overly formal sense unless expressly so defined herein.

Figure 2:
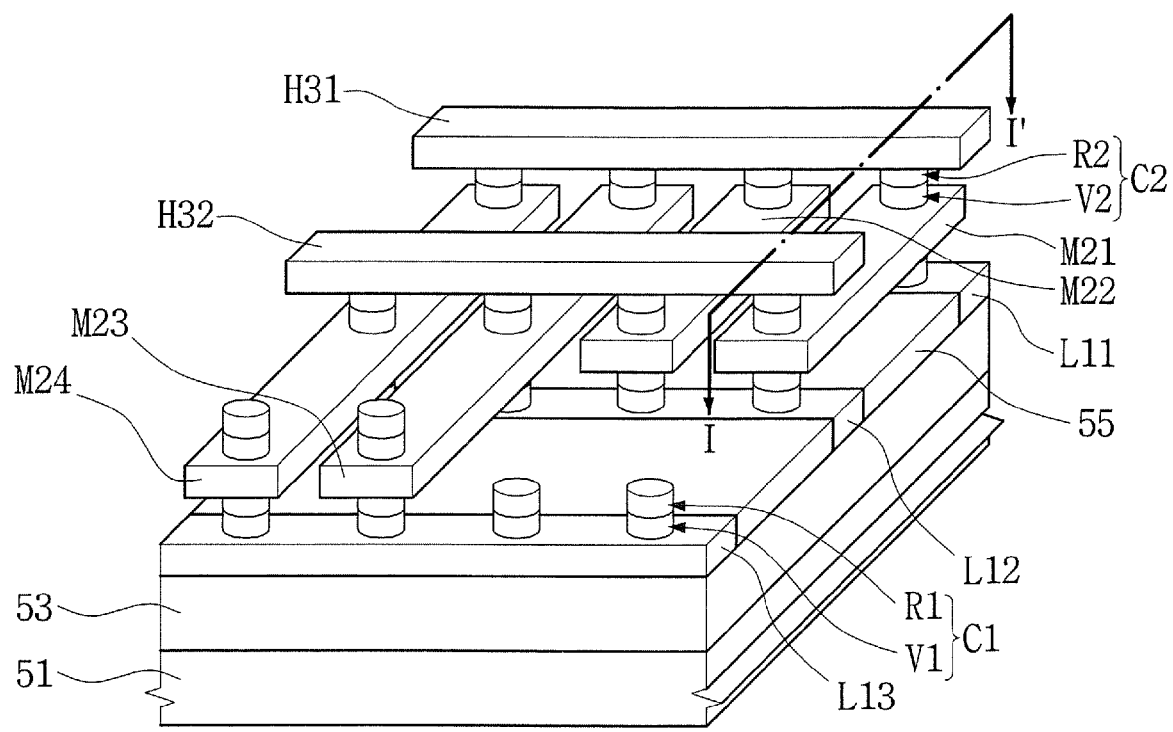
FIG. 2 is a perspective view of a RRAM corresponding to FIG. 1 according to an exemplary embodiment of the present invention.

FIG. 1 is an equivalent circuit diagram of a cell array region of a Resistance Random Access Memory (RRAM) according to an exemplary embodiment of the present invention, and FIG. 2 is a perspective view of a RRAM corresponding to FIG. 1 according to an exemplary embodiment of the present invention.

Referring to FIGS. 1 and 2, the RRAM according to an exemplary embodiment of the present invention may include lower interconnections L11, L12 and L13, intermediate interconnections M21, M22, M23 and M24 and upper interconnections H31, H32 and H33. The lower interconnections L11, L12 and L13 may be formed parallel to each other on a substrate 51. A first insulating layer 53 may be provided between the substrate 51 and the lower interconnections L11, L12 and L13. A second insulating layer 55 may be provided between the lower interconnections L11, L12 and L13 on the first insulating layer 53. The intermediate interconnections M21, M22, M23 and M24 may be disposed to cross over the lower interconnections L11, L12 and L13 to be formed parallel to each other. The upper interconnections H31, H32 and H33 may be disposed to cross over the intermediate interconnections M21, M22, M23 and M24 to be formed parallel to each other.

Lower resistance memory cells C1 may be formed at intersections of the lower interconnections L11, L12 and L13 and the intermediate interconnections M21, M22, M23 and M24. Each of the lower resistance memory cells C1 may include a lower variable resistance pattern R1 and a lower varistor V1, which are serially connected to each other. One end of the lower varistor V1 may be electrically connected to the lower interconnections L11, L12 and L13. One end of the lower variable resistance pattern R1 may be electrically connected to the intermediate interconnections M21, M22, M23 and M24.

Similarly, upper resistance memory cells C2 may be formed at intersections of the intermediate interconnections M21, M22, M23 and M24 and the upper interconnections H31, H32 and H33. Each of the upper resistance memory cells C2 may include an upper variable resistance pattern R2 and an upper varistor V2, which are serially connected to each other. One end of the upper varistor V2 may be electrically connected to the intermediate interconnections M21, M22, M23 and M24. One end of the upper variable resistance pattern R2 may be electrically connected to the upper interconnections H31, H32 and H33.

The varistors V1 and V2 may serve as a switching device that has characteristics of a bidirectional diode. The variable resistance patterns R1 and R2 may serve as a data storage element.

FIGS. 3 to 10 are cross-sectional views taken along line I-I' of FIG. 2, illustrating a method of manufacturing a RRAM according to a first exemplary embodiment of the present invention.

Figure 3:
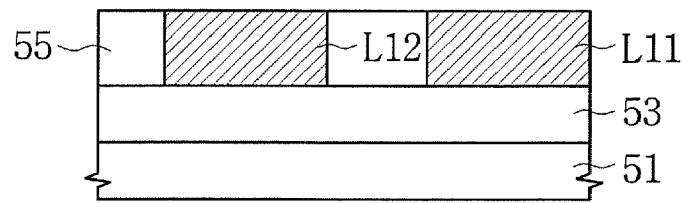
FIGS. 3 to 10 are cross-sectional views taken along line I-I' of FIG. 2, illustrating a method of manufacturing a RRAM according to a first exemplary embodiment of the present invention.

Referring to FIGS. 2 and 3, a first insulating layer 53 may be formed on a substrate 51. The substrate 51 may be a semiconductor substrate such as a silicon wafer. The first insulating layer 53 may be formed of a silicon oxide layer, a silicon nitride layer, a silicon oxynitride layer, or combinations thereof. The first insulating layer 53 may be formed to cover the substrate 51.

First and second lower interconnections L11 and L12 that are parallel to each other may be formed on the substrate 51. A second insulating layer 55 may be formed between the lower interconnections L11 and L12. The second insulating layer 55 may be formed of a silicon oxide layer, a silicon nitride layer, a silicon oxynitride layer, or combinations thereof. The lower interconnections L11 and L12 and the second insulating layer 55 may be planarized. In this case, upper surfaces of the lower interconnections L11 and L12 and the second insulating layer 55 may be formed at the same level. The lower interconnections L11 and L12 may be formed of a conductive layer such as a metal layer, a metal silicide layer, a polysilicon layer, an impurity doped single-crystal silicon layer or combinations thereof.

In another exemplary embodiment, the second insulating layer 55 may be formed on the first insulating layer 53 before forming the lower interconnections L11 and L12.

In still another exemplary embodiment, the lower interconnections L11 and L12 may be formed in the substrate 51.

Figure 4:
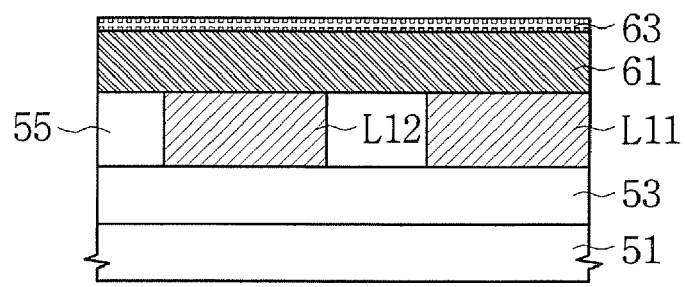

Referring to FIGS. 2 and 4, a first electrode layer 61 may be formed on the substrate 51. The first electrode layer 61 may be formed to cover the lower interconnections L11 and L12 and the second insulating layer 55. The first electrode layer 61 may be formed of one selected from the group consisting of an iridium (Ir) layer, a platinum (Pt) layer, a nickel (Ni) layer, a ruthenium (Ru) layer, a palladium (Pd) layer, a gold (Au) layer, a silver (Ag) layer, a copper (Cu) layer, and a cobalt (Co) layer.

A first leakage control layer (LCL) 63 may be formed on the first electrode layer 61. The first LCL 63 may be formed of one selected from the group consisting of a Mg layer, a Ta layer, an Al layer, a Zr layer, a Hf layer, a polysilicon layer, a conductive carbon group layer, and a Nb layer. The first LCL 63 may be formed to a thickness about of 0.1 nm to about 1 nm. However, the first LCL 63 may be omitted.

Figure 5:
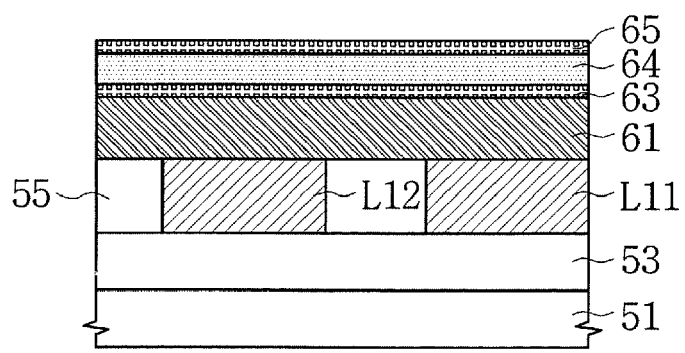

Referring to FIGS. 2 and 5, a first transition metal oxide layer 64 may be formed on the first LCL 63.

More specifically, the formation of the first transition metal oxide layer 64 may include depositing a transition metal layer on the first LCL 63, and then oxidizing the transition metal layer. The oxidation of the transition metal layer may be performed using a radical oxidation or plasma oxidation process. The oxidation process of the transition metal layer may be performed under conditions in which 10% to 20% under oxidation is generated compared to its stable state. That is, the first transition metal oxide layer 64 may be formed to contain an excessive transition metal compared to its stable state. In this case, the first transition metal oxide layer 64 may be formed of one selected from the group consisting of a TiO layer, a NbO layer, a NiO layer, a ZnO layer, a HfO layer, a YO layer, a VO layer, a CrO layer, a MoO layer, a WO layer, and a ZrO layer. The first transition metal oxide layer 64 may be formed to a thickness of about 0.5 nm to about 2 nm.

In another exemplary embodiment, the first transition metal oxide layer 64 may be formed of a material, in which one selected from the group consisting of Ir, Pt, Ru, Ni, Pd, Au, Ag, and Co, is added to one selected from the group consisting of a TiO layer, a NbO layer, a NiO layer, a ZnO layer, a HfO layer, a YO layer, a VO layer, a CrO layer, a MoO layer, a WO layer, and a ZrO layer at about 1 wt % to about 20 wt %.

A second LCL 65 may be formed on the first transition metal oxide layer 64. The second LCL 65 may be formed by the same method as that of the first LCL 63. The second LCL 65 may be formed of one selected from the group consisting of a Mg layer, a Ta layer, an Al layer, a Zr layer, a Hf layer, a polysilicon layer, a conductive carbon group layer, and a Nb layer. The second LCL 65 may be formed to a thickness of about 0.1 nm to about 1 nm.

Figure 6:
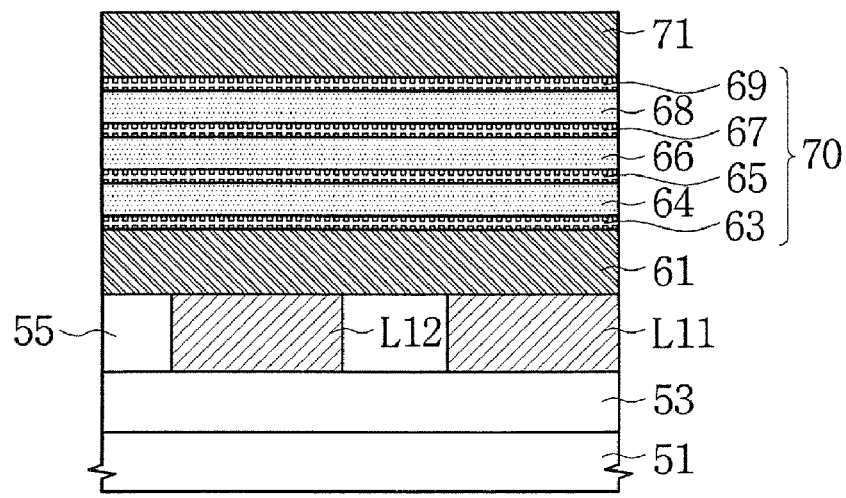

Referring to FIGS. 2 and 6, a second transition metal oxide layer 66 may be formed on the second LCL 65. The second transition metal oxide layer 66 may be formed by the same method as that of the first transition metal oxide layer 64.

The second transition metal oxide layer 66 may be formed of one selected from the group consisting of a TiO layer, a NbO layer, a NiO layer, a ZnO layer, a HfO layer, a YO layer, a VO layer, a CrO layer, a MoO layer, a WO layer, and a ZrO layer. The second transition metal oxide layer 66 may be formed to a thickness of about 0.5 nm to about 2 nm. In another exemplary embodiment of the present invention, the second transition metal oxide layer 66 may be formed of a material, in which one selected from the group consisting of Ir, Pt, Ru, Ni, Pd, Au, Ag, and Co, is added to one selected from the group consisting of a TiO layer, a NbO layer, a NiO layer, a ZnO layer, a HfO layer, a YO layer, a VO layer, a CrO layer, a MoO layer, a WO layer, and a ZrO layer at about 1 wt % to about 20 wt %.

A third LCL 67 may be formed on the second transition metal oxide layer 66. The third LCL 67 may be formed of one selected from the group consisting of a Mg layer, a Ta layer, an Al layer, a Zr layer, a Hf layer, a polysilicon layer, a conductive carbon group layer, and a Nb layer. The third LCL 67 may be formed to a thickness of about 0.1 nm to about 1 nm.

A third transition metal oxide layer 68 may be formed on the third LCL 67. The third transition metal oxide layer 68 may be formed by the same method as that of the second transition metal oxide layer 66.

The third transition metal oxide layer 68 may be formed of one selected from the group consisting of a TiO layer, a NbO layer, a NiO layer, a ZnO layer, a HfO layer, a YO layer, a VO layer, a CrO layer, a MoO layer, a WO layer, and a ZrO layer. The third transition metal oxide layer 68 may be formed to a thickness of about 0.5 nm to about 2 nm. In another exemplary embodiment, the third transition metal oxide layer 68 may be formed of a material, in which one selected from the group consisting of Ir, Pt, Ru, Ni, Pd, Au, Ag, and Co, is added to one selected from the group consisting of a TiO layer, a NbO layer, a NiO layer, a ZnO layer, a HfO layer, a YO layer, a VO layer, a CrO layer, a MoO layer, a WO layer, and a ZrO layer at about 1 wt % to about 20 wt %.

A fourth LCL 69 may be formed on the third transition metal oxide layer 68. The fourth LCL 69 may be formed of one selected from the group consisting of a Mg layer, a Ta layer, an Al layer, a Zr layer, a Hf layer, a polysilicon layer, a conductive carbon group layer, and a Nb layer. The fourth LCL 69 may be formed to a thickness of about 0.1 nm to about 1 nm.

The first LCL 63, the first transition metal oxide layer 64, the second LCL 65, the second transition metal oxide layer 66, the third LCL 67, the third transition metal oxide layer 68 and the fourth LCL 69, which are sequentially stacked, may constitute a lower varistor layer 70. Here, the first LCL 63 may be omitted. Also, the fourth LCL 69 may be omitted. Furthermore, the lower varistor layer 70 may be formed of the first transition metal oxide layer 64 and the second LCL 65. Moreover, the lower varistor layer 70 may be formed of the first transition metal oxide layer 64, the second LCL 65 and the second transition metal oxide layer 66.

A second electrode layer 71 may be formed on the lower varistor layer 70. The second electrode layer 71 may be formed to cover the fourth LCL 69. The second electrode layer 71 may be formed of the same material as the first electrode layer 61. The second electrode layer 71 may be formed of one selected from the group consisting of an Ir layer, a Pt layer, a Ni layer, an Ru layer, a Pd layer, an Au layer, an Ag layer, a Cu layer, and a Co layer. To However, the second electrode layer 71 may be formed of a different material from the first electrode layer 61.

Figure 7:
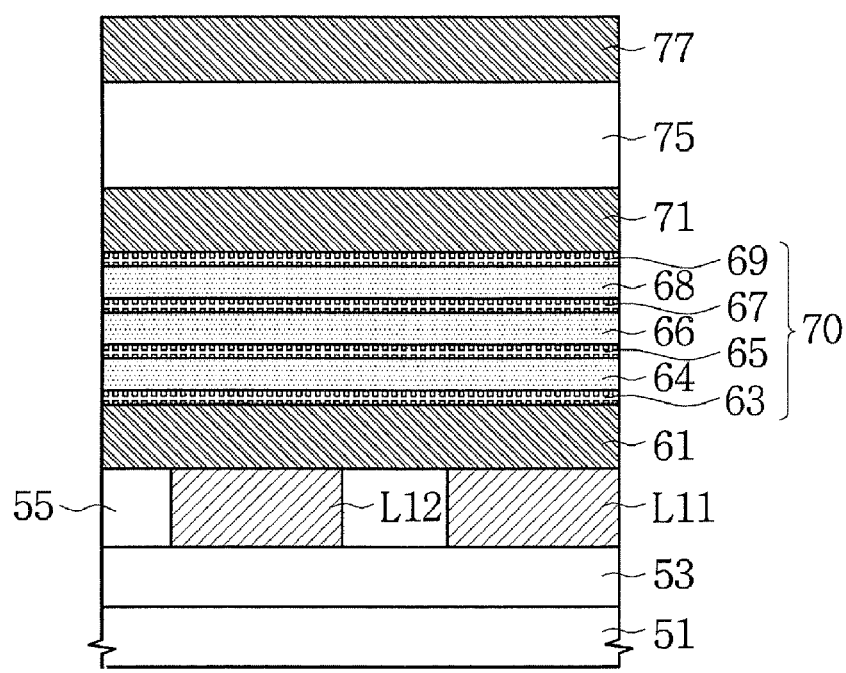

Referring to FIGS. 2 and 7, a lower variable resistance layer 75 may be formed on the second electrode layer 71. The lower variable resistance layer 75 may be formed of a transition metal oxide layer. For example, the lower variable resistance layer 75 may be formed of one selected from the group consisting of a NiO layer, a CoO layer, a ZnO layer, a CuO layer, a HfO layer, a ZrO layer, a TiO layer, a CrO layer, a FeO layer, a NbO layer, and combinations thereof. The lower variable resistance layer 75 may be formed of a different layer from the lower varistor layer 70.

A third electrode layer 77 may be formed on the lower variable resistance layer 75. The third electrode layer 77 may be formed of one selected from the group consisting of an iridium (Ir) layer, a platinum (Pt) layer, a nickel (Ni) layer, a ruthenium (Ru) layer, a palladium (Pd) layer, and a cobalt (Co) layer. However, the third electrode layer 77 may be omitted.

Figure 8:
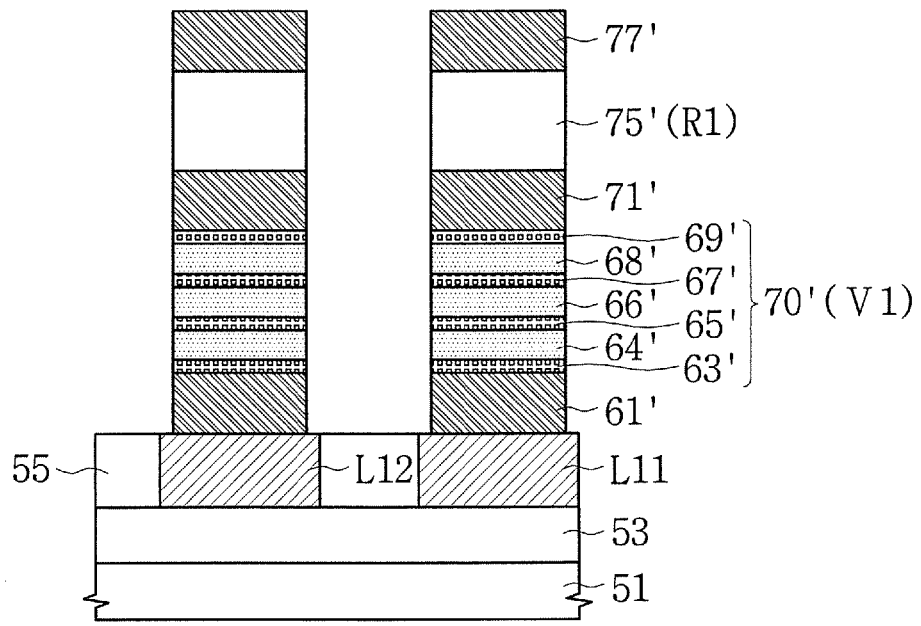

Referring to FIGS. 2 and 8, the third electrode layer 77, the lower variable resistance layer 75, the second electrode layer 71, the lower varistor layer 70 and the first electrode layer 61 may be sequentially patterned to form first electrodes 61', lower varistors 70', second electrodes 71', lower variable resistance patterns 75' and third electrodes 77' on the lower interconnections L11 and L12.

The first electrodes 61' may be in contact with the lower interconnections L11 and L12. The first electrodes 61' may be formed to be separated from each other. Each of the lower varistors 70' may include a first leakage control pattern 63', a first transition metal oxide pattern 64', a second leakage control pattern 65', a second transition oxide pattern 66', a third leakage control pattern 67', a third transition metal oxide pattern 68' and a fourth leakage control pattern 69', which are sequentially stacked.

Figure 9:
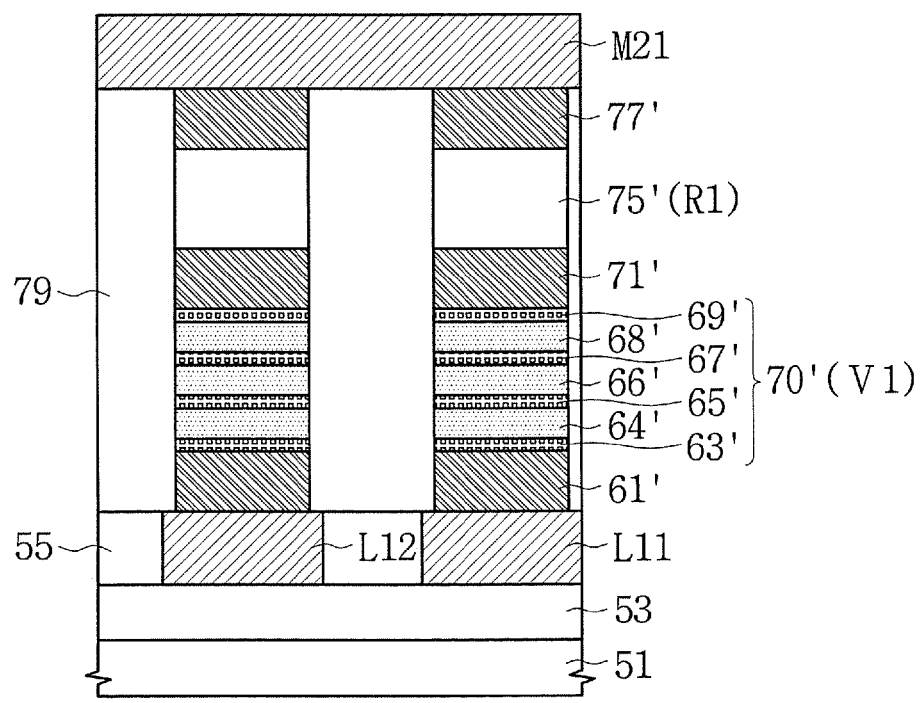

Referring to FIGS. 2 and 9, a third insulating layer 79 may be formed on the substrate 51. The third insulating layer 79 may be formed of a silicon oxide layer, a silicon nitride layer, a silicon oxynitride layer, or combinations thereof.

The third insulating layer 79 may be formed to cover the lower varistors 70' and the lower variable resistance patterns 75'. The third insulating layer 79 may be planarized to expose the third electrodes 77'. A chemical mechanical polishing (CMP) or etch-back process may be applied to the planarization of the third insulating layer 79.

An intermediate interconnection M21 that is in contact with the third electrodes 77' may be formed on the third insulating layer 79. The intermediate interconnection M21 may be formed of a conductive layer such as a metal layer, a metal silicide layer, a polysilicon layer or combinations layer. The intermediate interconnection M21 may be formed to cross over the lower interconnections L11 and L12.

Figure 10:
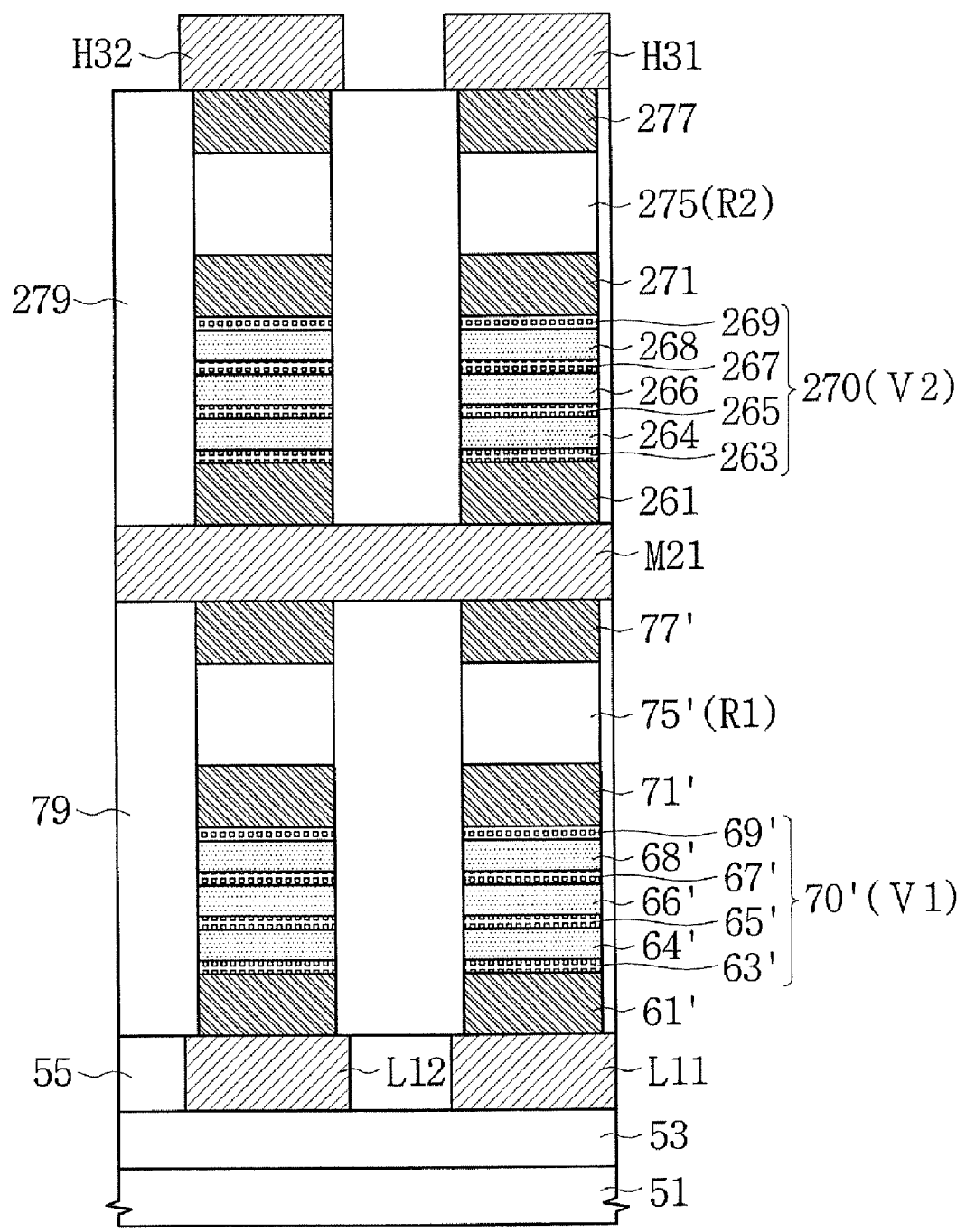

Referring to FIGS. 2 and 10, fourth electrodes 261, upper varistors 270, fifth electrodes 271, upper variable resistance patterns 275 and sixth electrodes 277 may be formed on the intermediate interconnection M21 using the same method as that described with reference to FIGS. 4 to 9.

The fourth electrodes 261 may be in contact with the intermediate interconnection M21. The fourth electrodes 261 may be formed to be separated from each other. Each of the upper varistors 270 may include a fifth leakage control pattern 263, a fourth transition metal oxide pattern 264, a sixth leakage control pattern 265, a fifth transition metal oxide pattern 266, a seventh leakage control pattern 267, a sixth transition metal oxide pattern 268 and an eighth leakage control pattern 269, which are sequentially stacked.

A fourth insulating layer 279 may be formed on the substrate 51. The fourth insulating layer 279 may be formed of a silicon oxide layer, a silicon nitride layer, a silicon oxynitride layer, or combinations thereof.

The fourth insulating layer 279 may be formed to cover the upper varistors 270 and the upper variable resistance patterns 275. The fourth insulating layer 279 may be planarized to expose the sixth electrodes 277. A CMP or etch-back process may be applied to the planarization of the fourth insulating layer 279.

Upper interconnections H31 and H32 that are in contact with the sixth electrodes 277 may be formed on the fourth insulating layer 279. The upper interconnections H31 and H32 may be formed of a conductive layer such as a metal layer, a metal suicide layer, a polysilicon layer or combinations layer. The upper interconnections H31 and H32 may be formed to cross over the intermediate interconnection M21 to be parallel to each other.

Figure 11:
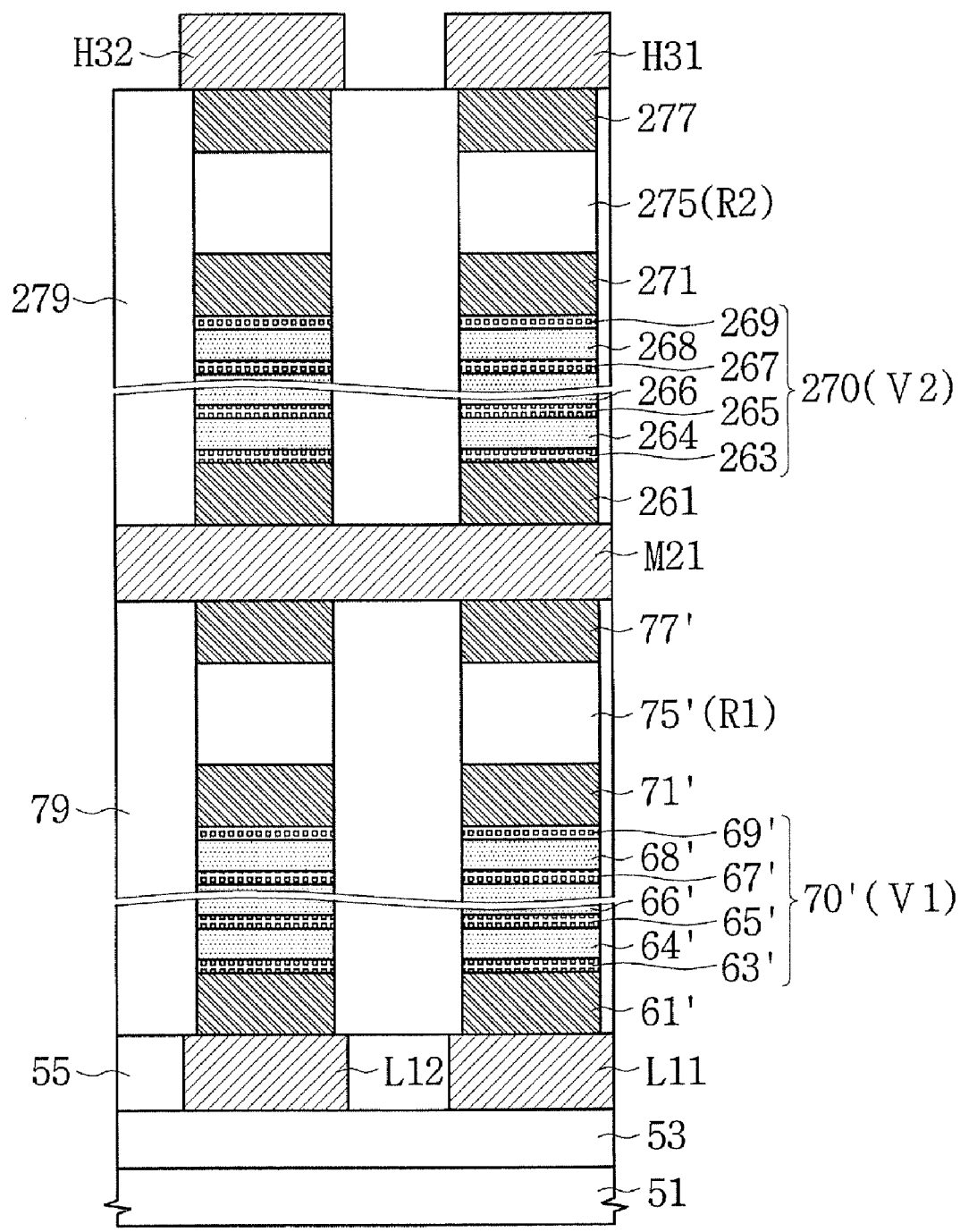
FIG. 11 is a cross-sectional view taken along line I-I' of FIG. 2, illustrating a method of manufacturing a RRAM according to a second exemplary embodiment of the present invention.

FIG. 11 is a cross-sectional view taken along line I-I' of FIG. 2, illustrating a method of manufacturing a RRAM according to a second exemplary embodiment of the present invention.

Referring to FIGS. 2 and 11, each of lower varistors 70' may be formed of a first leakage control pattern 63', a first transition metal oxide pattern 64', a second leakage control pattern 65', a second transition oxide pattern 66', a third leakage control pattern 67', a third transition metal oxide pattern 68', a fourth leakage control pattern 69' and a plurality of different transition metal oxide patterns (not shown). Furthermore, each of the lower varistors 70' may be formed to further include a plurality of different leakage control patterns (not shown).

Similarly, each of upper varistors 270 may be formed of a fifth leakage control pattern 263, a fourth transition metal oxide pattern 264, a sixth leakage control pattern 265, a fifth transition metal oxide pattern 266, a seventh leakage control pattern 267, a sixth transition metal oxide pattern 268, an eighth leakage control pattern 269 and a plurality of different transition metal oxide patterns (not shown). Furthermore, each of the upper varistors 270 may be formed to further include a plurality of different leakage control patterns (not shown).

Figure 12:
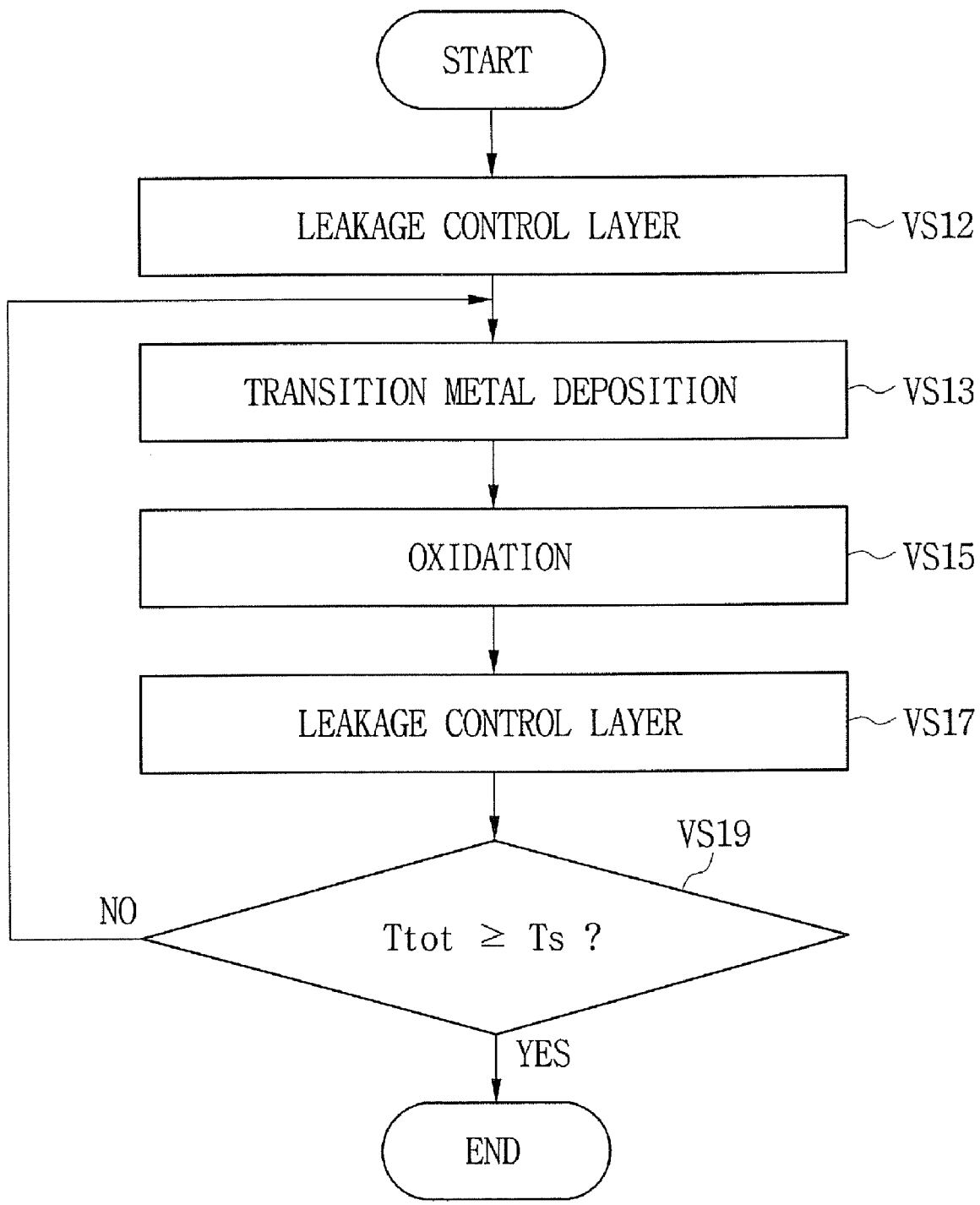
FIGS. 12 and 13 are process diagrams illustrating methods of manufacturing a varistor having a transition metal oxide layer according to exemplary embodiments of the present invention.
Figure 13:
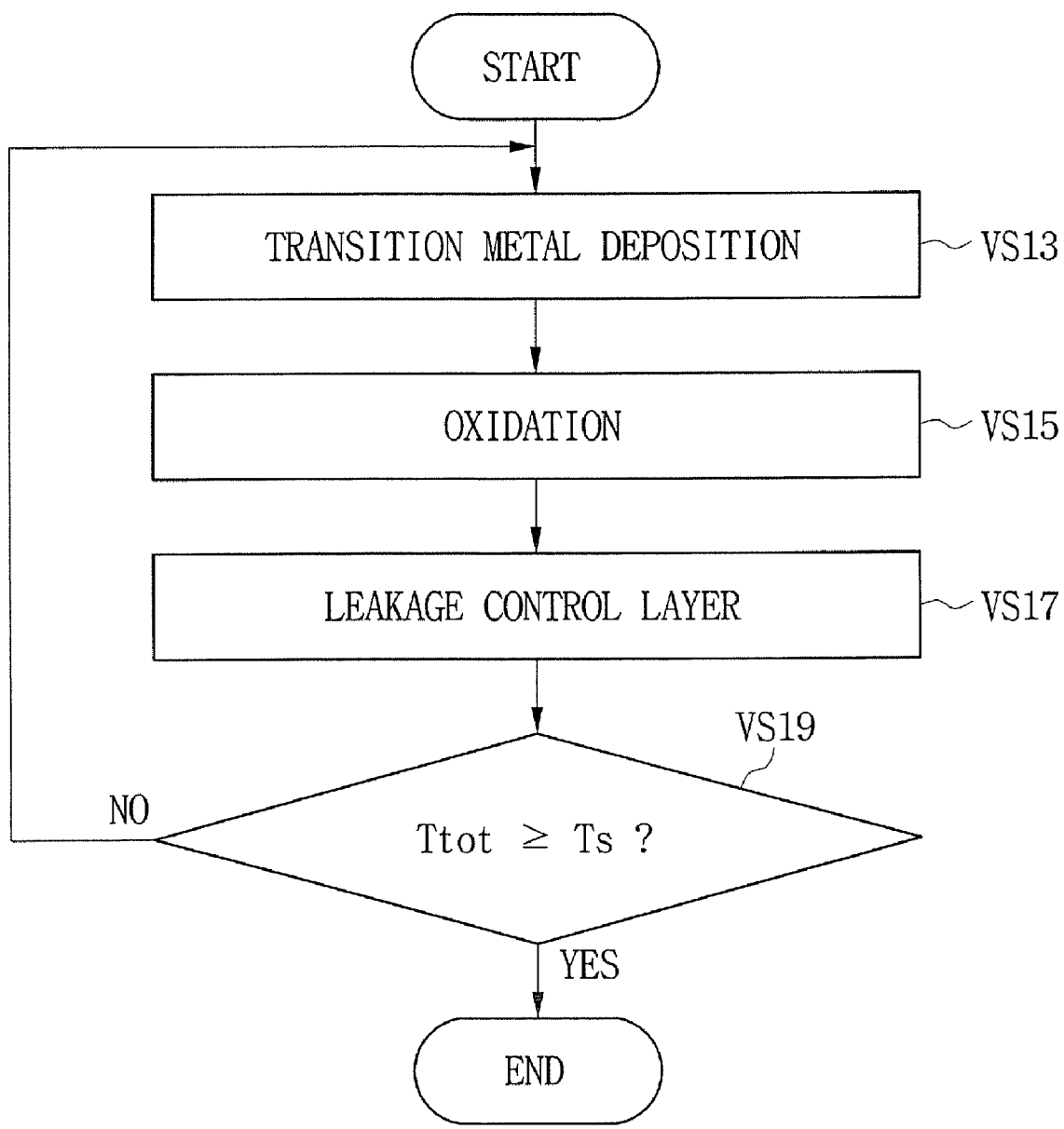

FIGS. 12 and 13 are process diagrams illustrating methods of manufacturing a varistor layer having a transition metal oxide layer according to exemplary embodiments of the present invention.

Referring to FIG. 12, a method of forming a varistor layer according to an exemplary embodiment of the present invention may include forming a first LCL (VS12), depositing a transition metal layer (VS13), oxidizing the transition metal layer (VS15), forming a second LCL (VS17), and repeatedly performing the process of depositing the transition metal layer (VS13) to the process of forming the second LCL (VS17) until a cumulative thickness $T_{tot}$ of the layers is equal to or larger than a desired thickness $T_S$ (VS19).

Referring to FIG. 13, a method of forming a varistor layer according to another exemplary embodiment of the present invention may include depositing a transition metal layer (VS13), oxidizing the transition metal layer (VS15), forming an LCL (VS17), and repeatedly performing process of depositing the transition metal layer (VS13) to the process of forming the LCL (VS17) until the cumulative thickness $T_{tot}$ of the layers is equal to or larger than the desired is thickness $T_S$ (VS19).

Methods of manufacturing a lower varistor layer 70 will be described below in detail with reference to FIGS. 4 to 6, 11 and 12.

Referring again to FIGS. 4 to 6, 11 and 12, a first LCL 63 may be formed on the substrate 51 having the first electrode layer 61 (VS12). The first LCL 63 may be formed of one selected from the group consisting of a Mg layer, a Ta layer, an Al layer, a Zr layer, a Hf layer, a polysilicon layer, a conductive carbon group layer, and a Nb layer. The first LCL 63 may be formed to a thickness of about 0.1 nm to about 1 nm. However, the process (VS12) of forming the first LCL 63 may be omitted.

A transition metal layer may be deposited on the first LCL 63 (VS13). The first LCL 63 may be formed of one selected from the group consisting of a Ti layer, a Nb layer, a Ni layer, a Zn layer, a Hf layer, a Y layer, a V layer, a Cr layer, a Mo layer, a W layer, and a Zr layer. Also, the transition metal layer may be formed of a material, in which one selected from the group consisting of Ir, Pt, Ru, Ni, Pd, Au, Ag, and Co, is added to one selected from the group consisting of a Ti layer, a Nb layer, a Ni layer, a Zn layer, a Hf layer, a Y layer, a V layer, a Cr layer, a Mo layer, a W layer, and a Zr layer. The transition metal layer may be formed using a sputtering technique.

The first transition metal oxide layer 64 may be formed using the process of oxidizing the transition metal layer (VS15). In this case, the first transition metal oxide layer 64 may be formed of one selected from the group consisting of a TiO layer, a NbO layer, a NiO layer, a ZnO layer, a HfO layer, a YO layer, a VO layer, a CrO layer, a MoO layer, a WO layer, and a ZrO layer. Also, the first transition metal oxide layer 64 may be formed of a material, in which one selected from the group consisting of Ir, Pt, Ru, Ni, Pd, Au, Ag, and Co is added to one selected from the group consisting of a TiO layer, a NbO layer, a NiO layer, a ZnO layer, a HfO layer, a YO layer, a VO layer, a CrO layer, a MoO layer, a WO layer, and a ZrO layer at about 1 wt % to about 20 wt %. The first transition metal oxide layer 64 may be formed to a thickness of about 0.5 nm to about 2 nm.

The process of oxidizing the transition metal layer (VS15) may include a radical oxidation process or a plasma oxidation process. The process of oxidizing the transition metal layer (VS15) may be performed in an in-situ process without vacuum break. An oxygen composition ratio of the first transition metal oxide layer 64 may vary depending on process conditions of the process of oxidizing the transition metal layer (VS15). For example, the oxygen composition ratio of the first transition metal oxide layer 64 may be determined depending on oxygen plasma process time, oxygen flow rate and power for generating oxygen plasma. Here, the process of oxidizing the transition metal layer (VS15) may be performed under conditions in which about 10% to about 20% under oxidation is generated compared to its stable state. That is, the first transition metal oxide layer 64 may be formed to contain an excessive transition metal compared to its stable state.

In contrast, the first transition metal oxide layer 64 may be formed using an $O_2$ reactive sputtering technique, a chemical vapor deposition technique or an atomic layer deposition technique.

A second LCL 65 may be formed on the first transition metal oxide layer 64 (VS17). The second LCL 65 may be formed using the same method as that of the first LCL 63.

Continuously, the process of depositing the transition metal layer (VS13) to the process of forming the second LCL (VS17) may be repeatedly performed until the cumulative thickness $T_{tot}$ of the first LCL 63, the first transition metal oxide layer 64 and the second LCL 65 is equal to or larger than the desired thickness $T_S$. For example, the process of depositing the transition metal layer (VS13) to the process of forming the second LCL (VS17) may be repeated 2 to 20 times to form the lower varistor layer 70.

Now, operations of a RRAM according to exemplary embodiments of the present invention will be described below with reference to FIGS. 1, 2, 10 and 11.

First, a method of selectively storing desired data in one of the lower resistance memory cells C1 may include applying a write voltage to a selected one of the intermediate interconnections M21, M22, M23 and M24 and a selected one of the lower interconnections L11, L12 and L13 corresponding thereto. Similarly, a method of selectively storing desired data in one of the upper resistance memory cells C2 may include applying a write voltage to a selected one of the intermediate interconnections M21, M22, M23 and M24 and a selected one of the upper interconnections H31, H32, and H33 corresponding thereto.

For example, a first write pulse corresponding to 0.5 times the write voltage may be applied to the first intermediate interconnection M21, and a second write pulse corresponding to 0.5 times the write voltage may be applied to the first lower interconnection L11. The first write pulse may have an opposite potential difference to the second write pulse. That is, the first write pulse may have a positive (+) potential difference, and the second write pulse may have a negative (−) potential difference. Accordingly, the write voltage may be applied to one of the lower resistance memory cells C1 connected to an intersection of the first intermediate interconnection M21 and the first lower interconnection L11. The write voltage enables the lower varistor V1 to be turned on, and the lower variable resistance pattern R1 to store desired data.

Also, the first write pulse corresponding to 0.5 times the write voltage may be applied to the first intermediate interconnection M21, and a third write pulse corresponding to 0.5 times of the write voltage may be applied to the first upper interconnection H31. The first write pulse may have an opposite potential difference to the third write pulse. That is, the first write pulse may have a positive (+) potential difference, and the third write pulse may have a negative (−) potential difference. Accordingly, the write voltage may be applied to one of the upper resistance memory cells C2 connected to an intersection of the first intermediate interconnection M21 and the first upper interconnection H31. The write voltage enables the upper varistor V2 to be turned on, and the upper variable resistance pattern R2 to store desired data.

Operations for reading the data stored in the lower resistance memory cells C1 may include applying a read voltage to a selected one of the intermediate interconnections M21, M22, M23 and M24 and a selected one of the lower interconnections L11, L12 and L13 corresponding thereto. Similarly, operations for reading the data stored in the upper resistance memory cells C2 may include applying a read voltage to a selected one of the intermediate interconnections M21, M22, M23 and M24 and a selected one of the upper interconnections H31, H32 and H33 corresponding thereto.

For example, a first read pulse corresponding to 0.5 times the read voltage may be applied to the first intermediate interconnection M21, and a second read pulse corresponding to 0.5 times of the read voltage may be applied to the first lower interconnection L11. The first read pulse may have an opposite potential difference to the second read pulse. Accordingly, the read voltage may be applied to one of the lower resistance memory cells C1 connected to an intersection of the first intermediate interconnection M21 and the first lower interconnection L11. The read voltage enables the lower varistor V1 to be turned on, and the data stored in the lower variable resistance pattern R1 to be read.

Also, the first read pulse corresponding to 0.5 times the read voltage may be applied to the first intermediate interconnection M21, and a third read pulse corresponding to 0.5 times of the read voltage may be applied to the first upper interconnection H31. The first read pulse may have an opposite potential difference to the third read pulse. Accordingly, the read voltage may be applied to one of the upper resistance memory cells C2 connected to an intersection of the first intermediate interconnection M21 and the first upper interconnection H31. The read voltage enables the upper varistor V2 to be turned on, and desired data stored in the upper variable resistance pattern R2 to be read.

Meanwhile, the plurality of lower resistance memory cells C1 and the plurality of upper resistance memory cells C2 may be connected to the first intermediate interconnection M21. In this case, the first read pulse or the first write pulse may be applied to the lower resistance memory cells C1 and the upper resistance memory cells C2, both of which are connected to the first intermediate interconnection M21. When the varistors V1 and V2 generate a leakage current by the first read pulse or the first write pulse, the resistance memory cells C1 and C2 may malfunction. That is, any leakage current should not be found when the varistors V1 and V2 are turned off.

According to exemplary embodiments, the varistors V1 and V2 may include the transition metal oxide patterns 64', 66', 68', 264, 266 and 268 and the leakage control patterns 63', 65', 67', 69', 263, 265, 267 and 269. The leakage control patterns 63', 65', 67', 69', 263, 265, 267 and 269 may be formed of one selected from the group consisting of a Mg layer, a Ta layer, an Al layer, a Zr layer, a Hf layer, a polysilicon layer, a conductive carbon group layer, and a Nb layer. The leakage control patterns 63', 65', 67', 69', 263, 265, 267 and 269 serve to reduce a leakage current when the varistors V1 and V2 are turned off.

Also, the varistors V1 and V2 may have high current drivability when the varistors V1 and V2 are turned off. The transition metal oxide patterns 64', 66', 68', 264, 266 and 268 may be formed of a material, in which one selected from the group consisting of Ir, Pt, Ru, Ni, Pd, Au, Ag, and Co, is added to one selected from the group consisting of a TiO layer, a NbO layer, a NiO layer, a ZnO layer, a HfO layer, a YO layer, a VO layer, a CrO layer, a MoO layer, a WO layer, and a ZrO layer at 1 wt % to 20 wt %. In this case, the current drivability may be increased when the varistors V1 and V2 are turned off.

EXPERIMENTAL EXAMPLES

Figure 14:
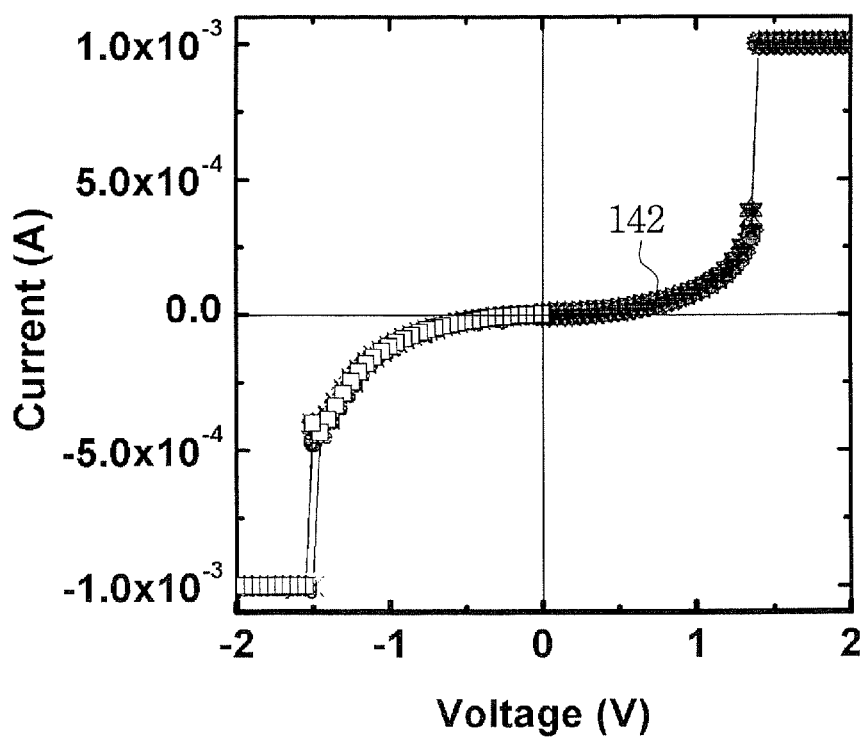
FIG. 14 is a graph showing the characteristics of a varistor manufactured according to exemplary embodiments of the present invention.

FIG. 14 is a graph showing the characteristics of a varistor manufactured according to exemplary embodiments of the present invention.

In FIG. 14, a voltage applied to both ends of the varistor is plotted on the horizontal axis, the unit is volt (V), a current flowing through the varistor is plotted on the vertical axis, and the unit is ampere (A). The varistor was formed to include first and second electrodes, first to tenth transition metal oxide patterns and first to tenth leakage control patterns. The first and second electrodes were formed of an Ir layer, each of the transition metal oxide patterns was formed of a TiO layer, to which Ir was added, to have a thickness of 1.5 nm, and each of the leakage control patterns was formed of a Mg layer of a thickness of 0.5 nm.

Curve 142 of FIG. 14 shows current-voltage characteristics of the varistor. As shown by curve 142, the varistor exhibited current characteristics close to 0 within a bias interval from −0.5V to +0.5V, and when a bias of +1.0 or higher or −1.0V or lower was applied, the varistor exhibited bidirectional diode characteristics that a considerable amount of current flows. That is, when the varistor was turned off, it was observed that any leakage current is not generated.

Figure 15:
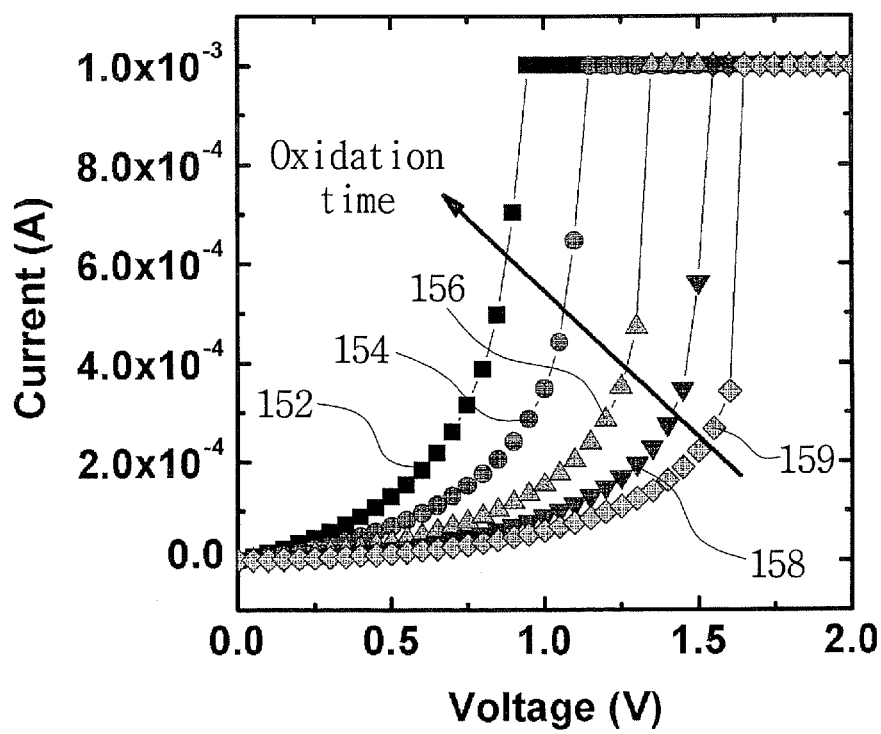
FIG. 15 is a graph of leakage current versus oxidation time in varistors manufactured according to exemplary embodiments of the present invention.

FIG. 15 is a graph of leakage current versus oxidation time in varistors manufactured according to exemplary embodiments of the present invention.

In FIG. 15, a voltage applied to both ends of a varistor is plotted on the horizontal axis, the unit is volt (V), a current flowing through the varistor is plotted on the vertical axis, and the unit is ampere (A). The varistor was formed to include first and second electrodes, first to seventh transition metal oxide patterns and first to seventh leakage control patterns. The first and second electrodes were formed of an Ir layer, and each of the leakage control patterns was formed of a Mg layer of a thickness of 0.5 nm.

After a Ti layer of a thickness of 1.0 nm was deposited on each of the transition metal oxide patterns, a radical oxidation process was performed on the deposited results for 120 seconds to 200 seconds, and then Ir was added.

Curves 152, 154, 156, 158 and 159 of FIG. 15 show current-voltage characteristics of the varistor, which were exhibited after the radical oxidation process was performed for 120 seconds, 140 seconds, 160 seconds, 180 seconds, and 200 seconds, respectively. Referring to curves 152, 154, 156, 158 and 159, it can be confirmed that the leakage current of the varistor is controlled by the oxidation time. For example, it can be interpreted that the leakage current of the varistor is increased as the oxidation time is short.

Figure 16:
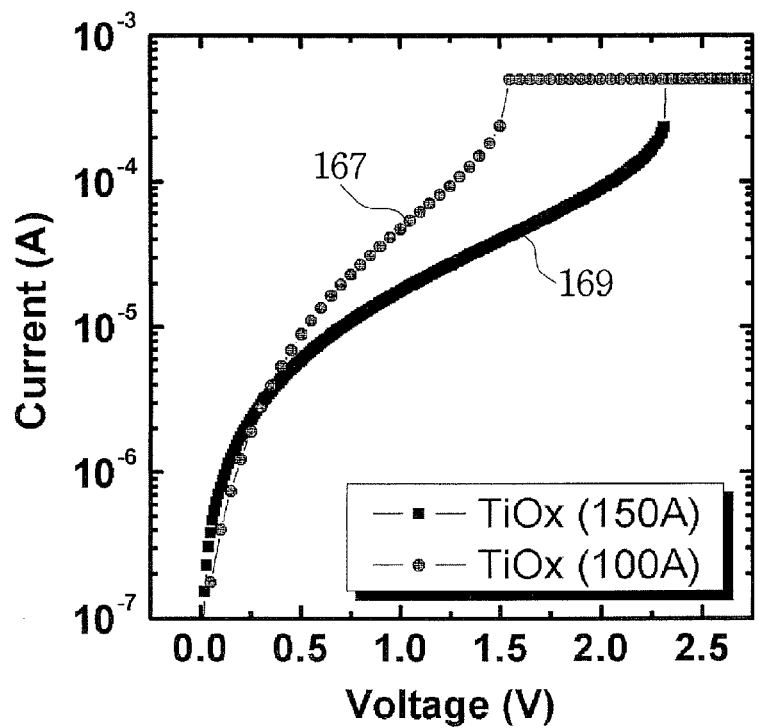
FIG. 16 is a graph of leakage current versus stacking number in varistors manufactured according to exemplary embodiments of the present invention.

FIG. 16 is a graph of leakage current versus stacking number in varistors manufactured according to exemplary embodiments of the present invention.

In FIG. 16, a voltage applied to both ends of a varistor is plotted on the horizontal axis, the unit is volt (V), a current flowing through the varistor is plotted on the vertical axis, and the unit is ampere (A). The varistor was formed to include first and second electrodes, a plurality of transition metal oxide patterns and a plurality of leakage control patterns. The first and second electrodes were formed of an Ir layer, and each of the transition metal oxide patterns was formed of a TiO layer, to which Ir was added, to have a thickness of 1.5 nm, and each of the leakage control patterns was formed of a Mg layer of a thickness of 0.5 nm. After a Ti layer was deposited on each of the transition metal oxide patterns, and a radical oxidation process was performed on the deposited results for 160 seconds.

Curve 167 of FIGS. 16 shows current-voltage characteristics of the varistor, which were exhibited when the 7-layer transition metal oxide patterns and the 7-layer leakage current patterns were alternately and repeatedly stacked. Also, curve 169 shows current-voltage characteristics of the varistor, which were exhibited when the 10-layer transition metal oxide patterns and the 10-layer leakage current patterns were alternately and repeatedly stacked. Curves 167 and 169 may be interpreted that the leakage current of the varistor is reduced as the stacking number of the transition metal oxide patterns and the leakage control patterns is increased.

Figure 17:
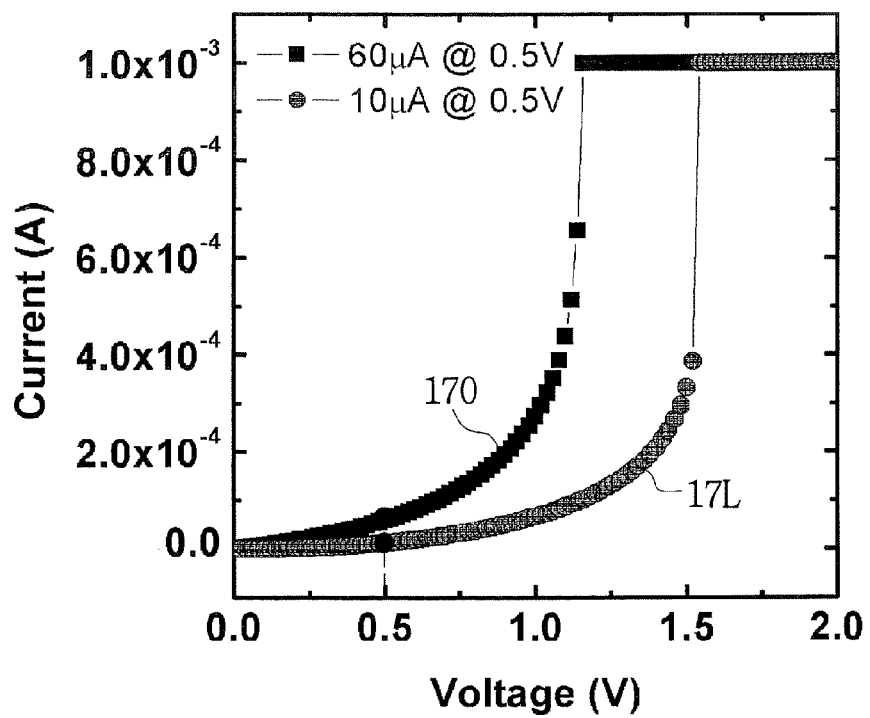
FIG. 17 is a graph showing the reduced leakage current characteristics of a leakage control layer in varistors manufactured according to exemplary embodiments of the present invention.

FIG. 17 is a graph showing the reduced leakage current characteristics of a leakage control layer in varistors manufactured according to exemplary embodiments of the present invention.

In FIG. 17, a voltage applied to both ends of a varistor is plotted on the horizontal axis, the unit is volt (V), a current flowing through the varistor is plotted on the vertical axis, and the unit is ampere (A). The varistor was formed to include first and second electrodes, a plurality of transition metal oxide patterns and a plurality of leakage control patterns. The first and second electrodes were formed of an Ir layer, each of the transition metal oxide patterns was formed of a TiO layer, to which Ir was added, to have a thickness of 1.5 nm, and each of the leakage control patterns was formed of a Mg layer of a thickness of 0.5 nm. After a Ti layer was deposited on each of the transition metal oxide patterns, a radical oxidation process was performed on the deposited results for 160 seconds.

Curve 17L of FIG. 17 shows current-voltage characteristics of the varistor, which were exhibited when the 7-layer transition metal oxide patterns and the 7-layer leakage current patterns were alternately and repeatedly stacked. Also, curve 170 shows current-voltage characteristics of the varistor, which were exhibited when only the 7-layer transition metal oxide patterns were stacked. From curve 17L, it can be confirmed that when a bias of 0.5V is applied to the varistor, a current of 10 µA may flow, and from curve 170, it can be confirmed that when a bias of 0.5V is applied to the varistor, a current of 60 μA may flow. That is, it may be interpreted that the leakage control patterns serve to reduce the leakage current of the varistor.

Figure 18:
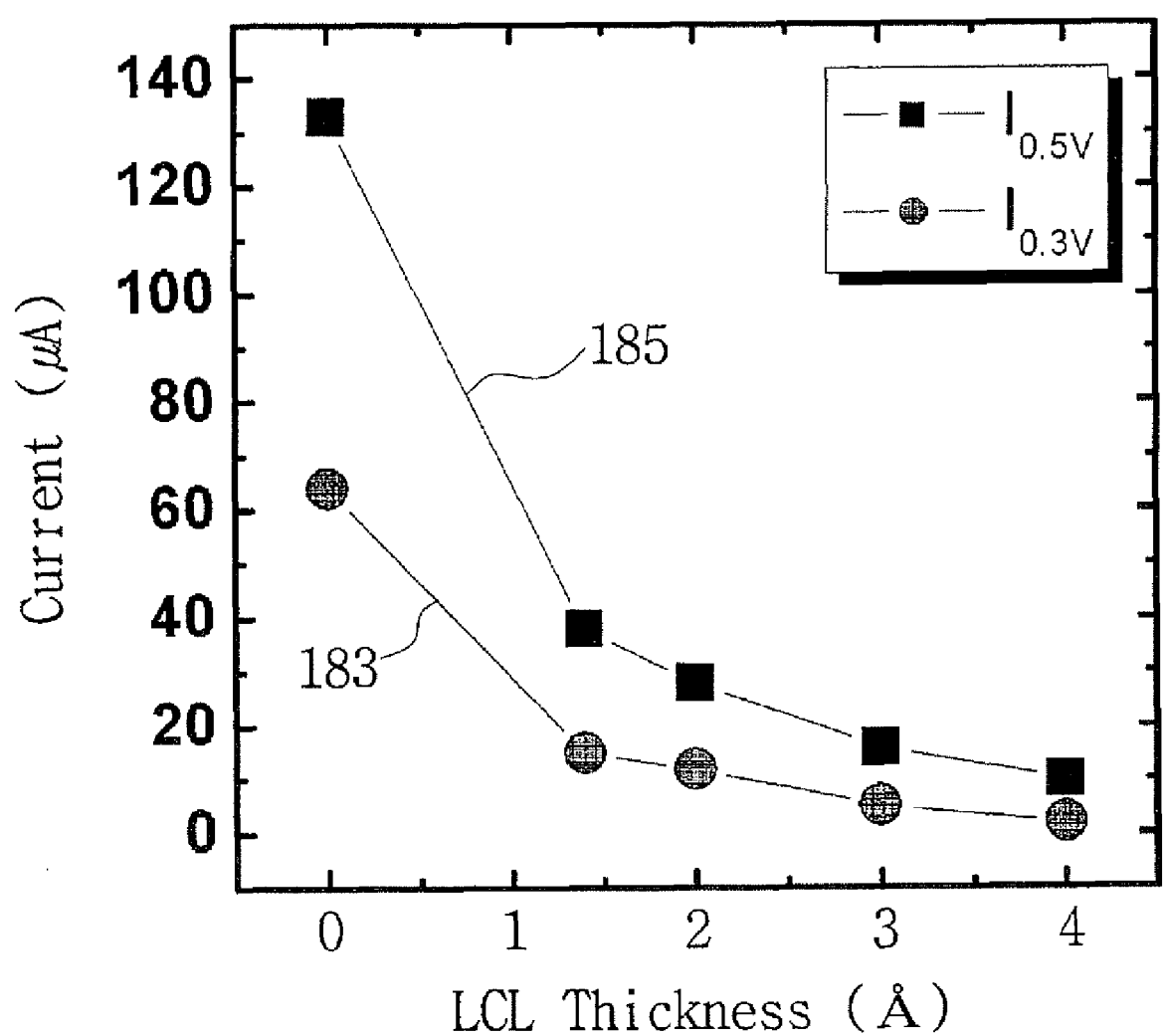
FIG. 18 is a graph of leakage current versus thickness of a leakage current layer in varistors manufactured according to exemplary embodiments of the present invention.

FIG. 18 is a graph of leakage current versus thickness of a leakage current layer in varistors manufactured according to exemplary embodiments of the present invention.

In FIG. 18, the thickness of a leakage control pattern is plotted on the horizontal axis, the unit is Angstrom (Å), a current flowing through the varistor is plotted on the vertical axis, and the unit is micro ampere (μA). The varistor was formed to include first and second electrodes, 7-layer transition metal oxide patterns and 7-layer leakage control patterns. The first and second electrodes were formed of an Ir layer, each of the transition metal oxide patterns was formed of a TiO layer, to which Ir was added, to have a thickness of 1.5 nm, and each of the leakage control patterns was formed of a Mg layer. After a Ti layer was deposited on each of the transition metal oxide patterns, a radical oxidation process was performed on the deposited results for 160 seconds.

Curve 183 of FIG. 18 is a current characteristic curve, which was exhibited when a bias of 0.3V was applied to the varistor, and curve 185 is a current characteristic curve, which was exhibited when a bias of 0.5V was applied to the varistor. From curves 183 and 185, it can be confirmed that as the thickness of the leakage control pattern is larger, the leakage current of the varistor is reduced.

This invention should not be construed as limited to the embodiments set forth herein and may be embodied in different forms. For example, the variable resistance patterns R1 and R2 may be replaced by one selected from the group consisting of a phase-change material layer, a polymer pattern, a magnetic tunnel junction (MTJ), and a ferroelectric pattern. That is, the present invention may be variously applied to a non-volatile memory device such as a Phase-change Random Access Memory (PRAM), a Polymer Random Access Memory (Polymer RAM), a Magnetic Random Access Memory (MRAM), a Ferroelectric Random Access Memory (FRAM), and a Resistance Random Access Memory (RRAM), and a manufacturing method thereof.

According to the present invention, a transition metal oxide layer and a leakage control layer are alternately stacked on a substrate 2 to 20 times to form a varistor. The leakage control layer is formed of one selected from the group consisting of a Mg layer, a Ta layer, an Al layer, a Zr layer, a Hf layer, a polysilicon layer, a conductive carbon group layer, and a Nb layer. The leakage control layer serves to reduce a leakage current when the varistor is turned off. That is, it serves as a switching device that does not generate any leakage current when the varistor is turned off. Consequently, a non-volatile memory device employing a switching device capable of preventing a snake current can be implemented.

Exemplary embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of forming a semiconductor device, comprising:
    stacking a transition metal oxide layer and a leakage control layer on a substrate to form a varistor layer, wherein the transition metal oxide layer contains an excessive transition metal compared to its stable state;
    forming a lower interconnection electrically connected to a lower end of the varistor layer; and
    forming an intermediate interconnection electrically connected to an upper end of the varistor layer.

2. The method of claim 1, further comprising forming a data storage element between the varistor layer and the intermediate interconnection.

3. The method of claim 2, further comprising:
    forming a first electrode between the lower interconnection and the varistor layer; and
    forming a second electrode between the varistor layer and the data storage element.

4. The method of claim 3, wherein the first electrode is formed of one selected from the group consisting of an iridium (Ir) layer, a platinum (Pt) layer, a nickel (Ni) layer, a ruthenium (Ru) layer, a palladium (Pd) layer, a gold (Au) layer, a silver (Ag) layer, a copper (Cu) layer, and a cobalt (Co) layer.

5. The method of claim 3, wherein the second electrode is formed of one selected from the group consisting of an iridium (Ir) layer, a platinum (Pt) layer, a nickel (Ni) layer, a ruthenium (Ru) layer, a palladium (Pd) layer, a gold (Au) layer, a silver (Ag) layer, a copper (Cu) layer, and a cobalt (Co) layer.

6. The method of claim 3, wherein the first electrode and the second electrode are formed of the same material.

7. The method of claim 2, wherein the data storage element is formed of one selected from the group consisting of a variable resistance layer, a phase-change material layer, a polymer pattern, a magnetic tunnel junction (MTJ), and a ferroelectric pattern.

8. The method of claim 7, wherein the variable resistance layer is formed of a transition metal oxide layer having a different composition ratio from the varistor layer.

9. The method of claim 2, further comprising:
    forming an upper varistor layer on the intermediate interconnection;
    forming an upper data storage element on the upper varistor layer; and
    forming an upper interconnection on the upper data storage element.

10. The method of claim 9, wherein forming the upper varistor layer comprises alternately stacking the transition metal oxide layer and the leakage control layer on the intermediate interconnection 1 to 20 times.

11. The method of claim 1, wherein the transition metal oxide layer is formed of one selected from the group consisting of a TiO layer, a NbO layer, a NiO layer, a ZnO layer, a HfO layer, a YO layer, a VO layer, a CrO layer, a MoO layer, a WO layer, and a ZrO layer.

12. The method of claim 1, wherein the transition metal oxide layer is formed of a material, in which one selected from the group consisting of Ir, Pt, Ru, Ni, Pd, Au, Ag, and Co, is added to one selected from the group consisting of a TiO layer, a NbO layer, a NiO layer, a ZnO layer, a HfO layer, a YO layer, a VO layer, a CrO layer, a MoO layer, a WO layer, and a ZrO layer.

13. The method of claim 1, wherein the leakage control layer is formed of one selected from the group consisting of a Mg layer, a Ta layer, an Al layer, a Zr layer, a Hf layer, a polysilicon layer, a conductive carbon group layer, and a Nb layer.

14. The method of claim 1, wherein the varistor layer is formed by alternately stacking the transition metal oxide layer and the leakage control layer 1 to 20 times.

15. A semiconductor device comprising:
a substrate;
a varistor disposed on the substrate and having a transition metal oxide pattern and a leakage control pattern, wherein the transition metal oxide pattern contains an excessive transition metal compared to its stable state;
a lower interconnection electrically connected to a lower end of the varistor; and
an intermediate interconnection crossing the lower interconnection and electrically connected to an upper end of the varistor.

16. The device of claim 15, further comprising a data storage element disposed between the varistor and the intermediate interconnection.

17. The device of claim 16, further comprising:
a first electrode disposed between the lower interconnection and the varistor; and
a second electrode disposed between the varistor and the data storage element.

18. The device of claim 17, wherein the first electrode and the second electrode are formed of the same material.

19. The device of claim 16, wherein the data storage element is formed of one selected from the group consisting of a variable resistance layer, a phase-change material layer, a polymer pattern, a magnetic tunnel junction (MTJ), and a ferroelectric pattern.

20. The device of claim 16, further comprising:
an upper interconnection crossing over the intermediate interconnection;
an upper varistor disposed between the intermediate interconnection and the upper interconnection; and
an upper data storage element disposed between the upper varistor and the upper interconnection.

21. The device of claim 20, wherein the upper varistor is formed by alternately stacking the transition metal oxide pattern and the leakage control pattern 1 to 20 times.

22. The device of claim 20, further comprising:
a third electrode disposed between the intermediate interconnection and the upper varistor; and
a fourth electrode disposed between the upper varistor and the upper data storage element.

23. The device of claim 22, wherein the third electrode and the fourth electrode are formed of the same material.

24. The device of claim 15, wherein the transition metal oxide pattern is formed of one selected from the group consisting of a TiO layer, a NbO layer, a NiO layer, a ZnO layer, a HfO layer, a YO layer, a VO layer, a CrO layer, a MoO layer, a WO layer, and a ZrO layer.

25. The device of claim 15, wherein the transition metal oxide pattern is formed of a material, in which one selected from the group consisting of Ir, Pt, Ru, Ni, Pd, Au, Ag, and Co, is added to one selected from the group consisting of a TiO layer, a NbO layer, a NiO layer, a ZnO layer, a HfO layer, a YO layer, a VO layer, a CrO layer, a MoO layer, a WO layer, and a ZrO layer.

26. The device of claim 15, wherein the leakage control pattern is formed of one selected from the group consisting of a Mg layer, a Ta layer, an Al layer, a Zr layer, a Hf layer, a polysilicon layer, a conductive carbon group layer, and a Nb layer.

27. The device of claim 15, wherein the varistor is formed by alternately stacking the transition metal oxide pattern and the leakage control pattern 1 to 20 times.

* * * * *